(12) United States Patent
Wan (10) Patent No.: US 8,174,298 B2
(45) Date of Patent: May 8, 2012

(54) METHOD AND APPARATUS FOR IMPROVING ACCURACY OF SIGNALS DELAY

(75) Inventor: Chen Wan, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/283,251

(22) Filed: Oct. 27, 2011

(65) Prior Publication Data
US 2012/0068747 A1    Mar. 22, 2012

Related U.S. Application Data

(62) Division of application No. 12/757,613, filed on Apr. 9, 2010, now Pat. No. 8,072,248.

(51) Int. Cl.
*H03L 7/06* (2006.01)
(52) U.S. Cl. .................... 327/158; 327/149
(58) Field of Classification Search .......... 327/231, 327/261, 149, 158
See application file for complete search history.

(56) References Cited

U.S. PATENT DOCUMENTS

| | | | |
|---|---|---|---|
| 5,614,868 A | 3/1997 | Nielson | |
| 6,798,858 B1 | 9/2004 | Atallah et al. | |
| 7,492,850 B2 * | 2/2009 | Menolfi et al. | 375/376 |
| 7,724,862 B2 * | 5/2010 | Menolfi et al. | 375/376 |
| 7,733,141 B2 * | 6/2010 | Oh | 327/158 |
| 7,750,698 B2 * | 7/2010 | Kim | 327/158 |
| 7,876,134 B2 * | 1/2011 | Jeong | 327/113 |
| 7,936,196 B2 * | 5/2011 | Kim et al. | 327/158 |
| 8,072,248 B2 * | 12/2011 | Wan | 327/158 |
| 2004/0085140 A1 * | 5/2004 | Yi | 331/16 |
| 2004/0145423 A1 * | 7/2004 | Kirsch | 331/57 |
| 2006/0250172 A1 * | 11/2006 | Kim | 327/158 |
| 2007/0252627 A1 * | 11/2007 | Kim | 327/158 |
| 2007/0279113 A1 * | 12/2007 | Maeda et al. | 327/158 |
| 2010/0201414 A1 * | 8/2010 | Oh | 327/158 |
| 2010/0237923 A1 * | 9/2010 | Terazawa et al. | 327/261 |
| 2010/0244916 A1 * | 9/2010 | Kim | 327/158 |
| 2010/0264960 A1 * | 10/2010 | Jeong | 327/114 |
| 2010/0289543 A1 * | 11/2010 | Wan | 327/158 |

FOREIGN PATENT DOCUMENTS

| | | |
|---|---|---|
| CN | 1581715 A | 2/2005 |
| CN | 1601953 A | 3/2005 |

OTHER PUBLICATIONS

US office action for U.S. Appl. No. 12/757,613, dated Apr. 9, 2010, total 6 pages.
US Notice of Allowance for U.S. Appl. No. 12/757,613, dated Jul. 28, 2011, total 19 pages.

* cited by examiner

*Primary Examiner* — Lincoln Donovan
*Assistant Examiner* — Adam Houston (57) ABSTRACT

A delay module, includes a first delay unit, a second delay unit and an inverter. Each of the first and second delay units includes: a logic gate for gating and a logic gate for delaying. The input port of the logic gate for gating of the first delay unit is electrically connected to the output port of the inverter; the output port of the logic gate for delaying of the first delay unit is electrically connected to the input port of the logic gate for delaying of the second delay unit; the input port of the inverter is electrically connected to the input port of the logic gate for gating of the second delay unit; the input port of the inverter is adapted to input a clock signal to be delayed, and the logic gate for delaying of the second delay unit is adapted to output a delayed clock signal.

8 Claims, 6 Drawing Sheets

METHOD AND APPARATUS FOR IMPROVING ACCURACY OF SIGNALS DELAY

CROSS-REFERENCE TO RELATED APPLICATIONS

This application is a divisional application of U.S. patent application Ser. No. 12/757,613, filed on Apr. 9, 2010, which claims priority to Chinese Patent Application No. 200910135287.8, filed on May 12, 2009. The afore-mentioned patent applications are hereby incorporated by reference in their entireties.

FIELD OF THE INVENTION

The present invention relates to signal processing technologies, and in particular, to a method and apparatus for improving accuracy of signals delay.

BACKGROUND

Currently, in a lot of chips, a phase delay relationship must be maintained for information exchange between two signals. Taking clock and data as an example, if the clock needs to sample data stably, the rising edge of the clock must have at least a setup time later than the data. However, due to the impact of the manufacturing technique, voltage and temperature (PVT), the delay requirement for these signals may be changed. In addition, the delay of a circuit that implements the delay requirement may be changed. Taking the most basic unit, the NAND gate, as an example, the drive power may turn higher as the temperature turns lower or the voltage turns higher. In this case, the delay time may also turn shorter. To guarantee the delay relationship between signals, the impact of the PVT needs to be compensated. One of compensation methods is using a digital locked loop (DLL). The DLL is used in various circuit systems, especially in high-speed circuits, to dynamically compensate the delay due to the impact of the PVT. The DLL generally consists of two parts: one part is used for dynamically detecting a clock period of the system and the other part is used for implementing a delay according to the detected clock period. In high-speed circuits, the clock period is as short as several nanosecond (ns for short), so that the DLL delay error is less than 100 picosecond (ps for short). With the evolution of technologies and increase of market demands, there are more and more high-speed chips. So, A DLL circuit with high accuracy is required. The DLL circuit generally consists of multiple delay units. The delay time of each delay unit is a delay step value of the DLL.

During the implementation of the present invention, the inventor discovers at least following problem in the prior art: The delay step value of the DLL in the prior art is less accurate, thus failing to meet the requirements for high-frequency circuits that require high accuracy.

SUMMARY

Embodiments of the present invention provide a delay module, a delay method, a clock detection apparatus, and a digital locked loop (DLL) to increase the accuracy of the DLL delay step value.

A delay module provided in an embodiment of the present invention includes a first delay unit, a second delay unit, and an inverter. Each of the first delay unit and the second delay unit includes two logic gates adapted to invert a phase: a logic gate for gating and a logic gate for delaying. An output port of the logic gate for gating is electrically connected to an input port of the logic gate for delaying; an input port of the logic gate for gating of the first delay unit is electrically connected to an output port of the inverter; an output port of the logic gate for delaying of the first delay unit is electrically connected to an input port of the logic gate for delaying of the second delay unit; and an input port of the inverter is electrically connected to an input port of the logic gate for gating of the second delay unit, where the input port of the inverter is adapted to input a clock signal to be delayed, and the logic gate for delaying of the second delay unit is adapted to output a delayed clock signal.

A delay method provided in an embodiment of the present invention includes: when the number of gated delay units is even, outputting a clock signal to be delayed after the clock signal passes through an inverter and gated delay units; and when the number of gated delay units is odd, outputting a clock signal to be delayed after the clock signal passes through the gated delay units, wherein, each delay unit includes two logic gates that convert a phase, a logic gate for gating and a logic gate for delaying, where an output port of the logic gate for gating of each delay unit is electrically connected to an input port of the logic gate for delaying of each delay unit, and the logic gates for delaying of the delay units are cascaded.

A clock detection apparatus is also provided in an embodiment of the present invention. The clock detection apparatus includes a delay module, and an adjusting module, the delay module including: a first delay unit, a second delay unit, and an inverter, each of the first delay unit and the second delay unit including two logic gates adapted to invert a phase: a logic gate for gating and a logic gate for delaying, an output port of the logic gate for gating electrically connected to an input port of the logic gate for delaying, where: an input port of the logic gate for gating of the first delay unit is electrically connected to an output port of the inverter; an output port of the logic gate for delaying of the first delay unit is electrically connect to an input port of the logic gate for delaying of the second delay unit; an input port of the inverter is electrically connected to an input port of the logic gate for gating of the second delay unit; and the input port of the inverter is adapted to input a clock signal to be delayed, and the logic gate for delaying of the second delay unit is adapted to output a delayed clock signal; the adjusting module including at least two adjusting units, where each adjusting unit includes a NOT gate and a selecting inverter; an output port of the NOT gate of each adjusting unit electrically connected to an input port of each selecting inverter; the NOT gates of the adjusting units mutually cascaded each other and the selecting inverters of the adjusting units mutually cascaded each other; where: an input port of a NOT gate of one adjusting unit is adapted to input a clock signal to be detected, and the selecting inverter of the one adjusting unit is adapted to output the delayed clock signal to the delay module as a clock signal to be delayed of the delay module.

A DLL is provided in an embodiment of the present invention. The DLL includes a clock detection apparatus, adapted to detect a clock period to be detected, where the clock detection apparatus includes a delay module and an adjusting module, the delay module including: a first delay unit, a second delay unit, and an inverter, each of the first delay unit and the second delay unit including two logic gates adapted to invert a phase: a logic gate for gating and a logic gate for delaying, an output port of the logic gate for gating electrically connected to an input port of the logic gate for delaying, where: an input port of the logic gate for gating of the first delay unit is electrically connected to an output port of the inverter; an output port of the logic gate for delaying of the first delay unit is electrically connect to an input port of the logic gate for delaying of the second delay unit; an input port of the inverter is electrically connected to an input port of the logic gate for gating of the second delay unit; and the input port of the inverter is adapted to input a clock signal to be delayed, and the logic gate for delaying of the second delay unit is adapted to output a delayed clock signal; the adjusting module including at least two adjusting units, where each adjusting unit includes a NOT gate and a selecting inverter; an output port of the NOT gate of each adjusting unit electrically connected to an input port of each selecting inverter; the NOT gates of the adjusting units mutually cascaded each other and the selecting inverters of the adjusting units mutually cascaded each other; where: an input port of a NOT gate of one adjusting unit is adapted to input a clock signal to be detected, and the selecting inverter of the one adjusting unit is adapted to output the delayed clock signal to the delay module as a clock signal to be delayed of the delay module.

According to the preceding technical solution, the delay unit provided in the embodiments of the present invention includes two logic gates: one gate for gating and the other for delaying; the clock signal to be delayed is input through the inverter or the logic gate for gating that acts as the delay unit directly; when one gated delay unit is added, one logic gate through which the clock signal is input is added accordingly. That is, in the embodiments of the present invention, the delay step value is the delay time of one logic gate. Compared with the prior art in which the delay step value is the delay time of two logic gates, the delay time of one logic gate improves the accuracy of the delay step value.

BRIEF DESCRIPTION OF THE DRAWINGS

To make the technical solution under the present invention or in the prior art clearer, the accompanying drawings for illustrating the embodiments of the present invention or illustrating the prior art are outlined below. Evidently, the accompanying drawings are exemplary only, and those skilled in the art can derive other drawings from such accompanying drawings without creative work.

DETAILED DESCRIPTION OF EMBODIMENTS

The following describes the technical solution of the present invention in detail with reference to the accompanying drawings and exemplary embodiments. These embodiments are only some embodiments of the present invention. Other embodiments that those skilled in the art obtain based on embodiments of the present invention without creative work fall into the scope of protection of the present invention.

In the prior art, the delay step value of the DLL is great because each delay unit generally has two or more logic gates for delaying. In the prior art, if the NAND gate is used as the logic gate for delaying, an even number logic gates is needed between two delay step to ensure that the output clock signal and the input clock signal are in the same phase. In the embodiments of the present invention, however, to minimize the delay step value, a delay module with one logic gate (for example, a NAND gate, a NOR gate, or a NOT gate) is used between two delay step. Similarly, to ensure that the output clock signal and the input clock signal are in the same phase, an input clock may be output after the input clock passes through the delay units via different paths according to whether the number of gated delay units is odd or even.

Figure 1:
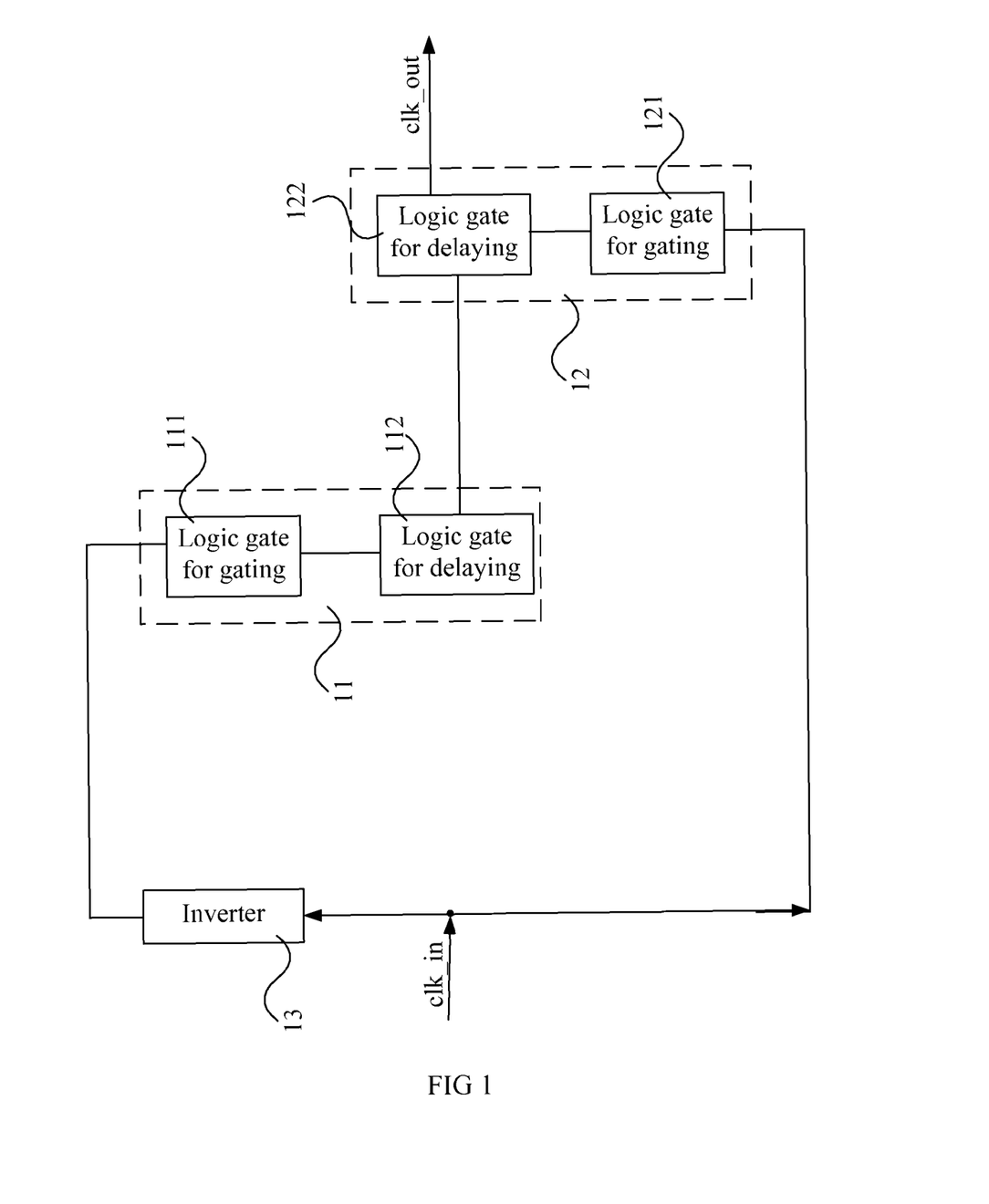
FIG. 1 shows a structure of a delay module in a first embodiment of the present invention.

FIG. 1 shows a structure of a delay module in the first embodiment of the present invention. The delay module includes a first delay unit 11, a second delay unit 12, and an inverter 13. Each of the first delay unit 11 and the second delay unit 12 includes two logic gates adapted to invert a phase: a logic gate for gating and a logic gate for delaying. The output port of the logic gate for gating is electrically connected to the input port of the logic gate for delaying. Therefore, the first delay unit 11 includes a logic gate 111 for gating and a logic gate 112 for delaying. The second delay unit 12 includes a logic gate 121 for gating and a logic gate 122 for delaying. The input port of the logic gate 111 for gating of the first delay unit 11 is electrically connected to the output port of the inverter 13; the output port of the logic gate 112 for delaying of the first delay unit 11 is electrically connected to the input port of the logic gate 122 for delaying of the second delay unit 12; the input port of the inverter 13 is electrically connected to the input port of the logic gate 121 for gating of the second delay unit 12; the input port of the inverter 13 is adapted to input a clock signal (clk_in) to be delayed, and the logic gate 122 for delaying of the second delay unit 12 is adapted to output a delayed clock signal (clk_out).

In this embodiment, the clock signal to be delayed is inputted through the inverter or the logic gate for gating that acts as the delay unit directly; each delay unit has one logic gate for delaying. When one gated delay unit is added, one logic gate through which the clock signal is input is added accordingly. That is, in this embodiment of the present invention, the delay step value is the delay time of one logic gate. Compared with the prior art in which the delay step value is the delay time of two logic gates, the present invention improves the accuracy of the delay step value.

On the basis of the first embodiment, more delay units may be added, so that the delay module can delay the clock signal longer.

Figure 2:
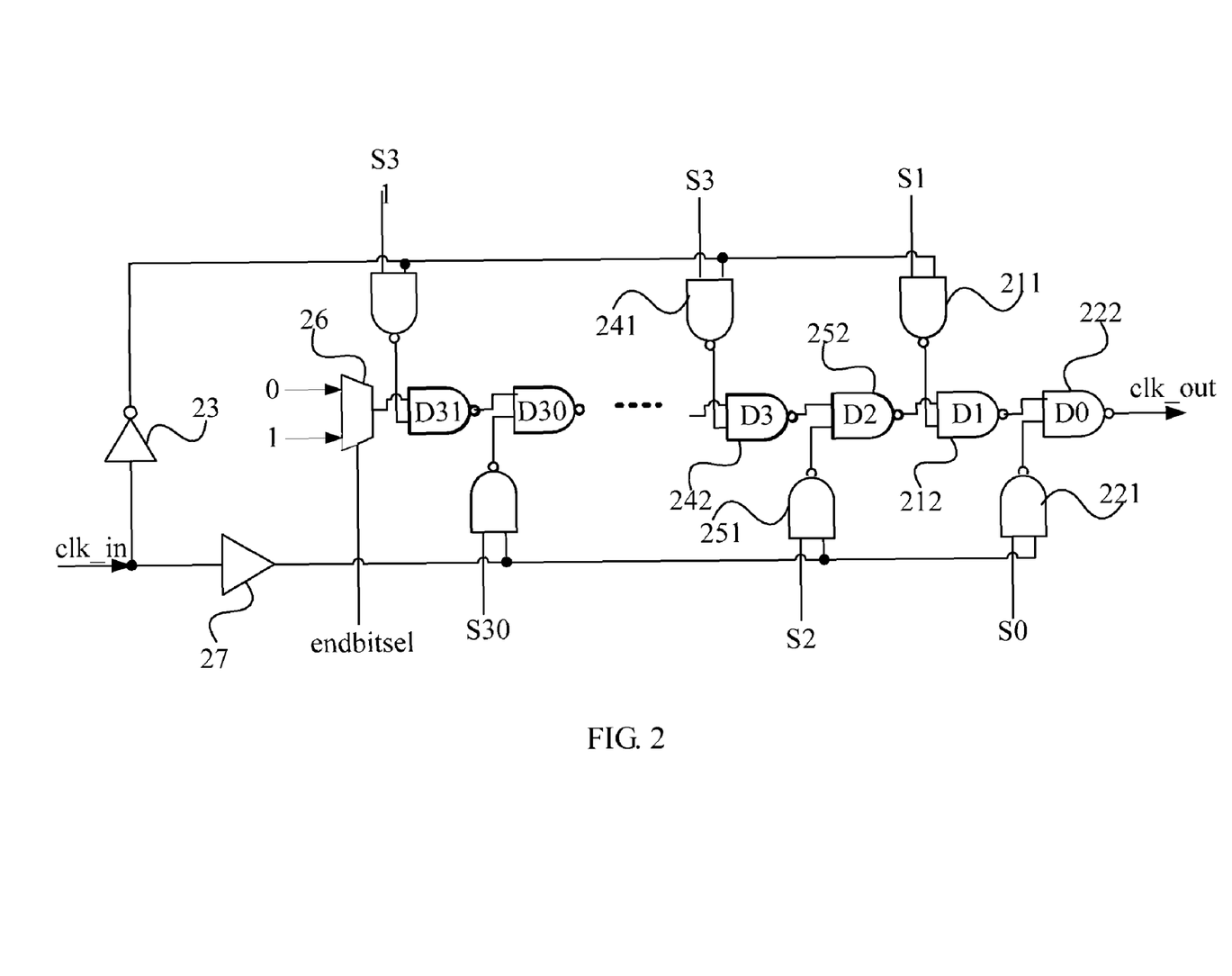
FIG. 2 shows a structure of a delay module in a second embodiment of the present invention.

FIG. 2 shows a structure of a delay module in the second embodiment of the present invention. The delay module includes the first delay unit that includes a logic gate 211 for gating and a logic gate 212 for delaying, the second delay unit that includes a logic gate 221 for gating and a logic gate 222 for delaying, and an inverter 23. The delay module further includes N third delay units, and M fourth delay units, where N and M are natural numbers and N is equal to M or is next to M. Each third delay unit and each fourth delay unit includes two logic gates adapted to invert a phase: a logic gate for gating and a logic gate for delaying. The output port of the logic gate for gating is electrically connected to the input port of the logic gate for delaying. The input ports of the logic gates 241 for gating of the N third delay units are electrically connected to the output port of the inverter 23. The input ports of the logic gates 251 for gating of the M fourth delay units are electrically connected to the input port of the logic gate 221 for gating of the second delay unit; the logic gates 252 for delaying of the M fourth delay units are cascaded with the logic gates 242 for delaying of the N third delay units in turn; the input port of the logic gate 212 for delaying of the first delay unit is electrically connected to the output port of the logic gate 252 for delaying of the fourth delay unit at the output port in the cascade direction.

In this embodiment, the logic gate may be a NAND gate, a NOR gate or a NOT gate. Supposing that the logic gate is a NAND gate, the delay module provided in this embodiment may further include a selector 26. When M is non zero and N is equal to or greater than M, the output port of the selector 26 is electrically connected to the input port of the logic gate 242 for delaying of the third delay unit 24; when M is non zero and N is smaller than M, the output port of the selector 26 is electrically connected to the input port of the logic gate 252 for delaying of the fourth delay unit; when M is zero, the output port of the selector is electrically connected to the input port of the logic gate 212 for delaying of the first delay unit. The input port of the logic gate for gating is further adapted to input a gating signal, where the input port of the logic gate for gating includes the logic gate for gating of the first delay unit, the logic gate for gating of the second delay unit, the logic gate for gating of the third delay unit, and the logic gate for gating of the fourth delay unit. The gating signal is adapted to obtain gated delay units; and the selector 26 is adapted to enable the logic gates for delaying of the gated delay units to invert the phase.

Further, to increase the accuracy of the delay module, the delay module in this embodiment may further include a buffer 27 that has the same delay time as the inverter 23. The buffer 27 is electrically connected to the input port of the inverter 23 and the input port of the logic gate 221 for gating of the second delay unit.

Figure 3:
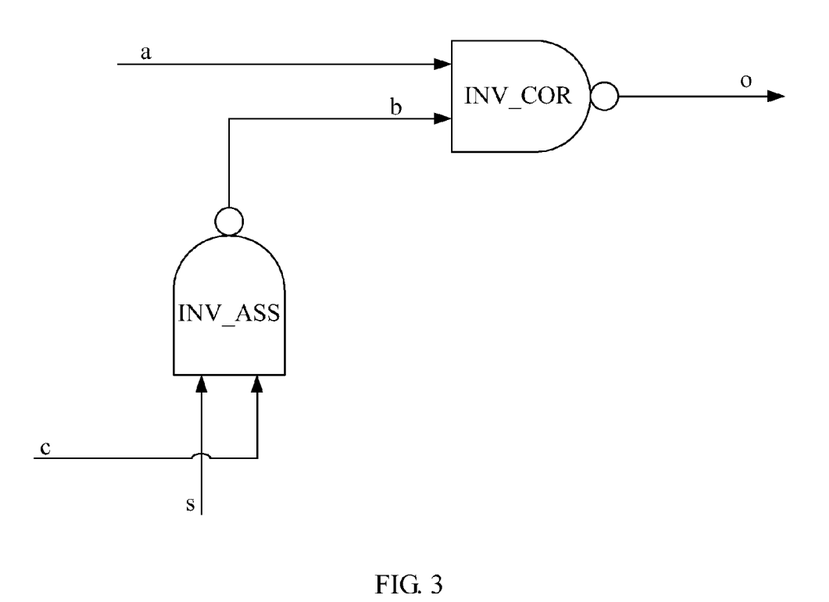
FIG. 3 shows a structure of a delay unit in the second embodiment of the present invention.

FIG. 3 shows a structure of a delay unit in the second embodiment of the present invention. As shown in FIG. 3, each delay unit includes two NAND gates: INV_COR and INV_ASS. The INV_COR is adapted to delay, and its input ports are a and b and output port is o. The INV_ASS is adapted to gate, and its input ports are s and c and output port is b, where port c is adapted to input clock signals and port s is adapted to input gating signals. When the input of port s of the INV_ASS is 0, the INV_ASS is not gated because the output of port b is always 1. The INV_ASS is gated only when the input of port s is 1; that is, the corresponding delay unit is gated.

With reference to FIG. 2, the following describes the operating principle of the preceding delay module.

Supposing that the delay module in this embodiment includes 32 delay units, where the 32 delay units include a first delay unit, a second delay unit, 15 third delay units, and 15 fourth delay units. The NAND gates for delaying of each delay unit are labeled D0, . . . , and D31, and gating signals are S (=S31, . . . , and S0), where S31 is adapted to control the 32nd delay unit (to which D31 belongs); S0 is adapted to control the first delay unit (to which D0 belongs), and the rest may be deduced in the same way.

When the number of delay units for delaying increases from one to two, the gating signals are changed from S=32'h1 to S=32'h2, where 32'h1 indicates that S consists of 32-bit binary numbers, represented by 00000001 in hexadecimal notation, that is, S0=1, while S1, . . . , and S31 are equal to 0; 32'h2 indicates that S1=1, while S0, S2, . . . , and S31 are equal to 0. When S is equal to 32'h1, the outputs of the gated parts of the second delay unit to the 32nd delay unit are equal to 1 because the gating signals of the gated parts that control the second delay unit to the 32nd delay unit are 0 and the gated parts are NAND gates. Because S0 is equal to 1, the delayed parts of the second delay unit to the 32nd delay unit and the NAND gate of the gated part of the first delay unit functionally work as an inverter (therefore, the input of one port of these NAND gates is 1). Because the input of one port of the gated part of the first delay unit is S0=1 and the input of the other port is clk_in, the output of the gated part of the first delay unit is $\overline{clk\_in}$. To ensure that the delayed output of the first delay unit is clk_in, the input of the other port (D0/a) of the delayed part of the first delay unit is 1. Because the number of ungated delay units is 31, the output of the selector needs to be 0. In this case, the other input (D0/a) of the delayed part of the first delay unit is 1 according to the connection relationship (that is, the output of the selector passes through 31 NAND gates that are equivalent to an inverter). Thus, the output of the delay unit is clk_in. At this time, the control signal endbitsel of the selector should be equal to 0. The operating principle of the selector is as follows: When endbitsel is 0, the output of the selector is 0; when endbitsel is 1, the output of the selector is 1.

According to the preceding principle, when S=32'h2, the output of the selector should be 1. In this case, the clk_in is output after passing through the NOT gate 23, the second delay unit 211 to which D1 belongs, and the delayed part (that is, the NAND gate D0) of the first delay unit. According to the preceding principle, when a delay unit is used, the clk_in is output after passing through two NAND gates (such as NAND gate 221, 222). When two delay units are used, the clk_in is output after passing through three NAND gates (such as NAND gate 211, 212, 222). In comparison with the case that only one delay unit is used, when two delay units are used, the delay time may increase by the time of passing through one NAND gate. Similarly, when a delay unit is added, the delay time may increase by the time of passing one NAND gate. That is, the delay step value is the time of one NAND gate. Because the NAND gate is a multi-input device with the shortest delay in the current standard basic unit, an accurate delay step value may be achieved in this embodiment.

The delay unit of the delay module in this embodiment includes two NAND gates. One of the two NAND gates is used for delaying to achieve a delay step value that is equal to the delay time of one NAND gate, and thus obtaining a smaller delay step value.

In this embodiment, a DLL delay line is built by using the NAND gate of the multi-input device with the shortest delay in the standard basic unit. The minimum adjustment step value of the DLL is the delay value of one NAND gate, thus improving the delay accuracy and adjustment accuracy of the DLL. The delay value of one NAND gate is about 0.035 ns in the worst case of the TSMC 90G process CLKNAND2X4. This reduces the delay adjustment step value of the DLL to about 0.035 ns, thus ensuring that the DLL can be used in high-frequency DDR controllers.

Table 1 lists the delay values in this embodiment in the worst case of the TSMC 90G process CLKNAND2X4. Table 2 and Table 3 list the delay values in the prior art in the worst case of the TSMC 90G process CLKNAND2X4. In table 1 to table 3, cap indicates the capacitance in pF, trans indicates the rising time in ns, and the delay value is in ns. According to the tables, the delay step value in this embodiment may be significantly reduced in comparison with that in the prior art.

TABLE 1

| | trans | | |
|---|---|---|---|
| cap | 0.032 | 0.048 | 0.08 |
| 0.00233 | 0.024832 | 0.031438 | 0.045419 |
| 0.005592 | 0.029222 | 0.035384 | 0.049793 |
| 0.012588 | 0.035783 | 0.0443 | 0.058 |

TABLE 2

| | trans | | |
|---|---|---|---|
| cap | 0.032 | 0.048 | 0.08 |
| 0.00233 | 0.046636 | 0.053618 | 0.067306 |
| 0.005592 | 0.050918 | 0.057887 | 0.071575 |
| 0.012588 | 0.059058 | 0.066044 | 0.079747 |

TABLE 3

| | trans | | |
|---|---|---|---|
| cap | 0.032 | 0.048 | 0.08 |
| 0.00233 | 0.091533 | 0.010242 | 0.012156 |
| 0.005592 | 0.096027 | 0.106935 | 0.126049 |
| 0.012588 | 0.0104956 | 0.115852 | 0.13499 |

A delay method corresponding to the preceding delay module is provided in an embodiment of the present invention. The delay method includes: when the number of gated delay units is even, outputting a clock signal to be delayed after the clock signal passes through an inverter and gated delay units; when the number of gated delay units is odd, outputting a clock signal to be delayed after the clock signal passes through the gated delay units.

Each delay unit includes two logic gates adapted to invert a phase: a logic gate for gating and a logic gate for delaying, where the output port of the logic gate for gating of each delay unit is electrically connected to the input port of the logic gate for delaying of each delay unit, and the logic gates for delaying of the delay units are cascaded.

Further, to increase the delay accuracy, the clock signal to be delayed is buffered and then output after passing through the gated delay units when the number of delay units is odd. The buffering delay time is the same as that of the inverter. For example, as shown in FIG. 2, when the gated delay unit is a delay unit where D0 is located, the clock signal to be delayed (clk_in) is output after passing through the buffer 27 and the delay unit where D0 is located.

In this embodiment, the clock signal to be delayed is input through the inverter or the logic gate for gating that acts as the delay unit directly; each delay unit has one logic gate for delaying; when one gated delay unit is added, one logic gate through which the clock signal is input is added accordingly. That is, in this embodiment of the present invention, the delay step value is the delay time of one logic gate. Compared with the prior art in which the delay step value is the delay time of two logic gates, this increases the accuracy of the delay step value.

The DLL generally consists of a master module and a slave module. The master module, which is also called a clock detection apparatus, is adapted to: dynamically detect the clock period of the system and output delay steps corresponding to the clock period to compensate the impact of the PVT and provide a reference for the delay of the slave module. The slave module, which is also called a delay apparatus, is adapted to delay the clk_in.

Specifically, the clock detection apparatus may include the preceding delay module and is adapted to dynamically detect the clock period. By using the clock detection apparatus, the clock period may be converted to the number of delay units to compensate the impact of the PVT.

Further, although the delay module may achieve a high accuracy, the total adjustable delay time of the delay module is short. In fact, however, a long delay time needs to be adjusted. Thus, the clock detection apparatus provided in this embodiment may further include an adjusting module. The adjusting module adjusts the current delay value close to the expected delay value, and then adjusts the accuracy through the delay module.

Figure 4:
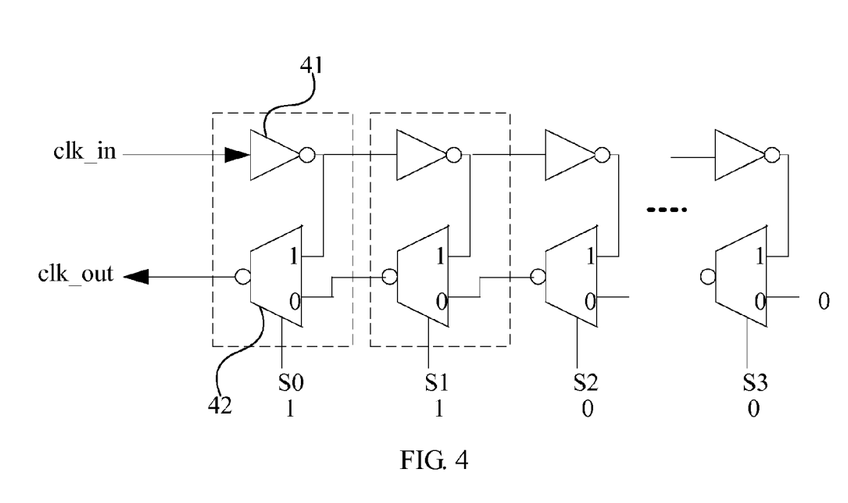
FIG. 4 shows a structure of an adjusting module in an embodiment of the present invention.

FIG. 4 shows a structure of an adjusting module in an embodiment of the present invention. The adjusting module includes multiple adjusting units, each of which includes a NOT gate 41 and a selecting inverter 42. The output port of the NOT gate 41 is electrically connected to an input port of the selecting inverter 42; the NOT gates 41 of the adjusting units are mutually cascaded, and the selecting inverters 42 of the adjusting units are mutually cascaded; the input port of the NOT gate 41 is adapted to input a clock signal (clk_in) to be delayed; and the inverter is adapted to output the delayed clock signal (clk_out). When the adjusting module is adapted to detect the clock period, the clock signal to be delayed input by the adjusting module is the clock signal to be detected.

In this embodiment, the one-hot mode is used to control the number of adjusting units to implement delaying. When S0 is '1', the adjusting module selects an adjusting unit to delay the clk_in signal; when S1 is 1, the delay line selects two adjusting units to delay the clk_in, and the rest may be deduced in the same way. In the DLL, the delay control state machine controls the adjusting module to adjust the number of adjusting units, and adjusts the delay close to the value to be delayed. For example, if the delay value of an adjusting unit is 0.15 ns, the value to be delayed is 1 ns. In this case, six adjusting units may be adjusted to the delay of 0.9 ns, which has an error of 0.1 ns with the delay value of 1 ns. At this time, the delay module of the present invention may be adapted to further adjust the delay to remove the error of 0.1 ns.

In this embodiment, by setting an adjusting module in the DLL, the area of the delay module may be reduced when the delay time remains unchanged, thus reducing the area of the DLL.

Figure 5:
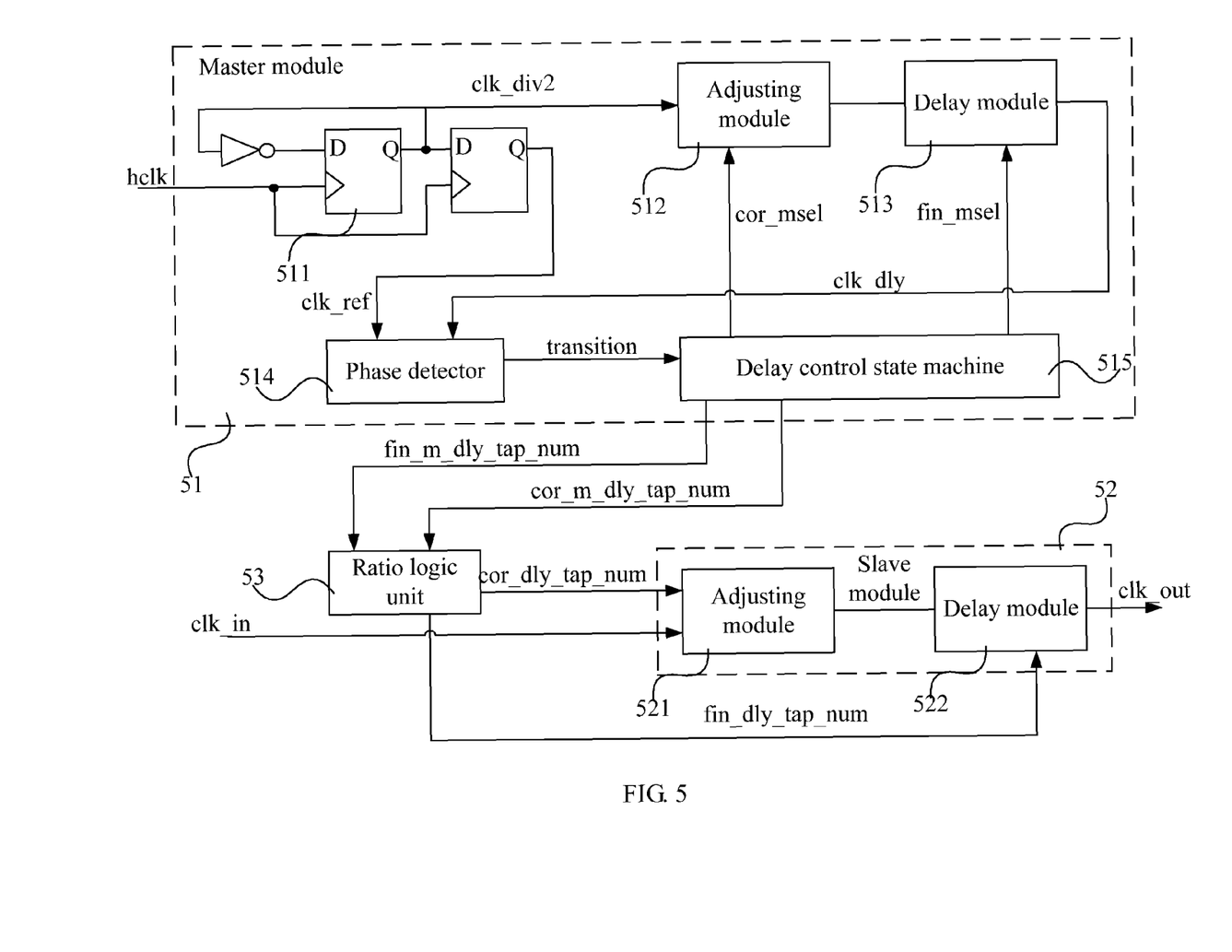
FIG. 5 shows a structure of a DLL in a third embodiment of the present invention.

On the basis of the preceding delay module and the adjusting module, this embodiment may provide a clock detection apparatus adapted to dynamically detect a clock period to be detected and convert the clock period to the number of delay units and the number of adjusting units. The clock detection apparatus includes the preceding delay module and adjusting module. The input of the adjusting module is a clock signal to be detected, and the output of the adjusting module acts as the clock signal to be delayed of the delay module. The clock detection apparatus further includes a trigger, a phase detector, and a delay control state machine. The trigger is electrically connected to the adjusting module and the phase detector; the phase detector is electrically connected to the delay module and the delay control state machine; the delay control state machine is electrically connected to the adjusting module and the delay module. The trigger is adapted to output the clock signal to be detected to the adjusting module and the phase detector; the phase detector is adapted to obtain a transmission control signal according to the input clock signal to be detected and the delayed clock signal that passes through the adjusting module and the delay module; the delay controller is adapted to convert the clock period to the number of adjusting units in the adjusting module and the number of delay units in the delay module according to the transmission control signal. A DLL is also provided in an embodiment of the present invention. The DLL includes the preceding clock detection apparatus and a delay apparatus. The delay apparatus is electrically connected to the clock detection apparatus and adapted to delay the clock signal to be delayed by the delay time corresponding to $kN_1$ adjusting units and $kN_2$ delay units, where k indicates the clock period delay ratio and $N_1$ and $N_2$ respectively indicate the number of adjusting units and the number of delay units equivalent to the clock period. The delay ratio may be provided by the ratio logic unit. The details are as follows:

FIG. 5 shows a structure of a DLL in the third embodiment of the present invention. As shown in FIG. 5, the DLL includes a master module 51 (that is, a clock detection apparatus), a slave module 52 (that is, a delay apparatus), and a ratio logic unit 53. The master module 51 includes a D trigger 511, an adjusting module 512, a delay module 513, a phase detector 514, and a delay control state machine 515. The slave module includes an adjusting module 521 and a delay module 522.

The master module 51 inputs a clock signal hclk. This clock signal is changed to clk_div2 after the clock signal passes through one D trigger, and is further changed to clk_ref after the clock signal passes through another D trigger. The delay control state machine 515 outputs a control signal cor_msel to the adjusting module 512, and outputs a control signal fin_msel to the delay module 513. It controls the adjusting module 512 and the delay module 513 to delay the related number of delay units by outputting control signals to the adjusting module 512 and the delay module 513. For example, when cor_msel is 4, the adjusting module adds four gated delay units each time; when fin_msel=1, the delay module adds one gated delay unit each time. A clock signal clk_dly is output after the clock signal passes through the adjusting module and the delay module. The clk_ref and the clk_dly are used as the inputs of the phase detector 514. When the phase detector detects that these two clock signals are in the same phase, the phase detector outputs "transition=0"; other it retains "transition=1".

The input clock signal of the slave module is clk_in. The slave module is adapted to delay the clk_in and obtain the delayed output clock signal clk_out. The DLL dynamically detects the clock period, and converts the clock period to the number of delay units and the number of adjusting units. The master module of the DLL converts the clock period to the number of adjusting units (cor_m_dly_tap_num) and the number of delay units (fin_m_dly_tap_num). Because the slave module is delayed based on the clock period, for example, the delay module generally needs to be delayed by one fourth of a clock period, the delay control state machine may output the number of adjusting units and the number of delay units to respectively the adjusting module and the delay module of the slave module through the ratio logic unit 53. The adjusting module and the delay module of the slave module adjust their own number of gated adjusting units or number of gated delay units according to the number of delay units (cor_dly_tap_num and fin_dly_tap_num) processed by using the ratio algorithm, and delays the input clk_in.

In this embodiment, the master module may dynamically convert the clock period to the number of adjusting units and the number of delay units to compensate the impact of the PVT. In addition, by setting the adjusting module and the delay module, the area of the DLL may be reduced by using the adjusting module, and the delay accuracy may be guaranteed by using the delay module.

What has been described above is the operating principle of the delay module. The following, from the perspective of the relationship between signals, explains why the total delay time of the delay module should not be too long in order to ensure that the input clock signal can be output after a correct delay.

Figure 6:
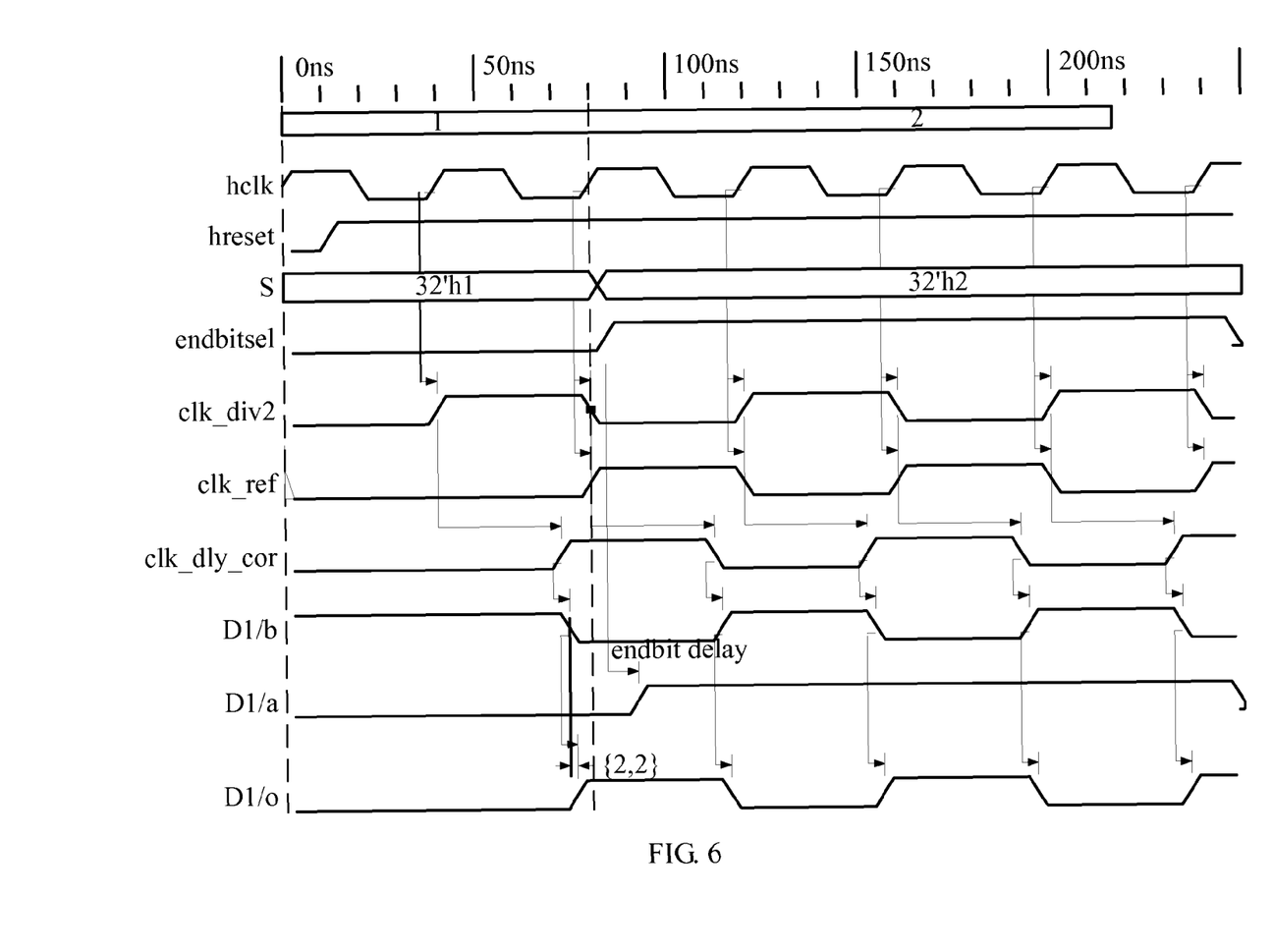
FIG. 6 is a schematic diagram illustrating waveforms of some signals inside the DLL in an embodiment of the present invention.

FIG. 6 is a schematic diagram illustrating waveforms of some signals inside the DLL in an embodiment of the present invention. According to the operating principle of the above circuit structure, in the delay module, when the gating signals are changed from S=32'h1 to S=32'h2, because the output of the selector is controlled by the control signal endbitsel and it takes a certain time to send the endbitsel to port a of D1, the input of port a of D1 must be 0 within this time to shield the input of the clk_in, thus avoiding burrs of the clk_in.

As shown in FIG. 6, the gating signal S and the endbitsel are obtained by sampling the hclk. Thus, the signals S and endbitsel hop at the rising edge of the hclk. In FIG. 6, the endbitsel signal is changed at the time of 80 ns (The period of the hclk is supposed to be 5 ns. This period is scaled up by the ratio of 1:8 in this figure. That is, the actual period of the hclk is 40 ns). That is, the input signal of port a of D31 is changed from 0 to 1 at the time of 80 ns. Then, the hop edge can be sent to D1 only after passing through 31 delay units. It is assumed that the transmission takes 8 ns (because the number of delay modules is very small and the delay of each delay unit is very short, the total delay of all the delay units of the whole delay module may not exceed 20% of the clock period.). Thus, port a of D1 is changed from 0 to 1 at the time of 88 ns (that is, an 8 ns endbit delay occurs to the endbitsel and D1/a). When port a of D1 is changed to '1', the clk_in may be directly connected to D1. However, the clk_in is isolated and the output of D1 is always 1 from the time when D1 is gated to the time when port a of D1 is changed to '1'. If port c of D1 has a hop edge at this time, this hop edge may be shielded. The following analyzes whether this case may occur. The input clock of the adjusting module in the master module is clk_div2 (frequency-halved hclk). This clock is changed to a clk_dly_cor signal after being delayed by the adjusting module. Because the adjusting module has already delayed the whole clock period, the rising edge of the clk_dly_cor is at the time of 74 ns, as shown in FIG. 6. The clock signal clk_dly_cor is input through one NOT gate to port c of D1 as the clock input of the delay module. After this clock signal reaches port b, the rising edge is changed to a falling edge. At the time of 80 ns (that is, the time when the S and endbitsel signals are changed), port b of D1 is always low level, which is maintained for a clock period until 114 ns. When port b of D1 is '0', the input signal of port a of D1 can be any value, and even '0'. Thus, only when the delay of the delay module does not exceed the duration for which port b of D1 maintains the low level, the delay of port a of the delaying unit due to the change of the endbitsel may not affect the output.

In this embodiment, the master module is adapted to dynamically convert the clock period to the number of adjusting units and the number of delay units and detect the clock period. The clock period detection may be implemented by the delay control state machine.

Figure 7:
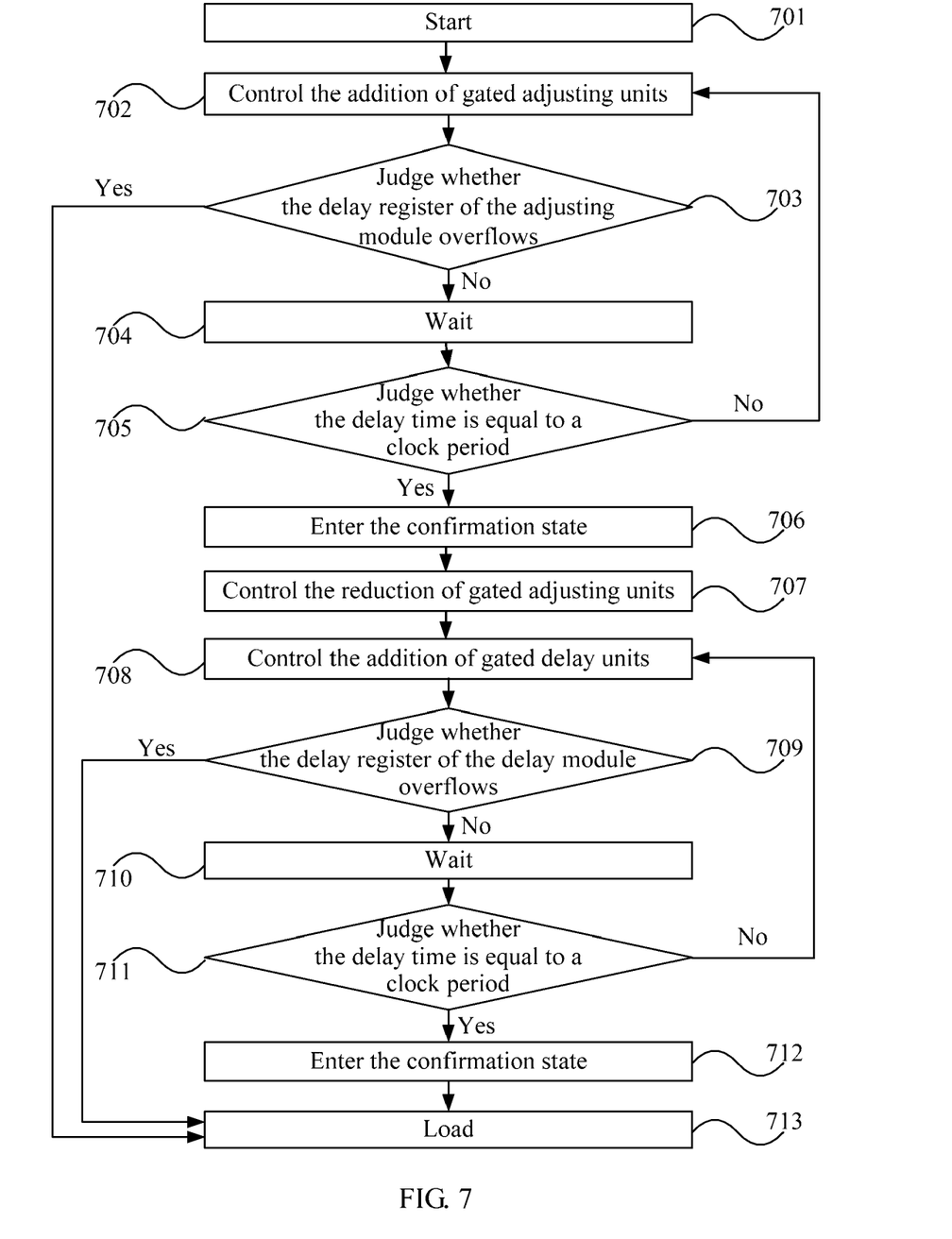
FIG. 7 is a flowchart of a method for detecting a clock period dynamically by a delay control state machine in an embodiment of the present invention.

FIG. 7 is a flowchart of a method for detecting a clock period dynamically by the delay control state machine in an embodiment of the present invention.

Step 701: Receive a reset signal. When the reset signal is valid, enter the idle state and wait for the beginning of the detection.

Step 702: When the reset signal is invalid, enter the increasing state, and control the adjusting module to add gated adjusting units in turn. The number of added adjusting units each time may be specified by cor_msel. For example, if cor_msel is 4, it indicates that four adjusting units are added each time.

Step 703: Judge whether the delay control register of the adjusting module overflows. If the delay control register of the adjusting module overflows, go to step 713. If the delay control register of the adjusting module does not overflow, go to step 704. The delay control register is adapted to control the adjusting module and the delay module to add gated delay units. Supposing that the delay control register that controls the adjusting module is 128 bits, when cor_msel [127] is 1, it indicates that the delay control register overflows; when cor_msel [127] is 0, it indicates that the delay control register does not overflow.

Step 704: Enter the waiting state. Because the transmission of signals in the system needs to be delayed by the components, a certain waiting time is required. For example, wait for eight clock periods.

Step 705: Enter the detection state, and judge whether the delay time is equal to a clock period. If the delay time is equal to a clock period, go to step 706. If the delay time is not equal to a clock period, go to step 702. Specifically, the delay control state machine may judge whether the delay time is equal to a clock period by judging whether the transition is equal to 1. According to the preceding operating principle of the circuit, when the transition is equal to 0, it indicates that the delay time is equal to a clock period.

Step 706: Enter the confirmation state. To ensure that the delay time is exactly a clock period, the delay control state machine may judge whether the transition is equal to 1 for many times, for example, 15 times. When it is determined that the transition is equal to 0 for consecutive 15 times, the delay time is a clock period. Then, the process goes to step 707. Thus, the following problem may be solved: The transition may be changed to 0 occasionally due to errors, but the delay time does not reach a clock period.

Step 707: Enter the reduction state, and control the adjusting module to reduce the number of gated delay units indicated by cor_msel through the cor_msel signal. For example, four gated delay units are reduced. In addition, the fine adjustment indication is set to be valid. For example, the fin_process is set to 1. In this case, the delay control state machine completes the rough adjustment positioning, and then enters the fine adjustment state.

Step 708: Enter the fine adjustment increasing state, and control the delay module to add gated delay units in turn. The number of added delay units each time may be specified by fin_msel. For example, if fin_msel is 1, it indicates that one delay unit is added each time.

Step 709: Judge whether the delay control register of the adjusting module overflows. If the delay control register of the adjusting module overflows, go to step 713. If the delay control register of the adjusting module does not overflow, go to step 710.

Step 710: Enter the waiting state. Because the transmission of signals in the system needs to be delayed by the components, a certain waiting time is required. For example, wait for eight clock periods.

Step 711: Enter the detection state, and judge whether the delay time is equal to a clock period. If the delay time is equal to a clock period, go to step 712. If the delay time is not equal to a clock period, go to step 708. Specifically, the delay control state machine may judge whether the delay time is equal to a clock period by judging whether the transition is equal to 1. According to the preceding operating principle of the circuit, when the transition is equal to 0, it indicates that the delay time is equal to a clock period.

Step 712: Enter the confirmation state. To ensure that the delay time is exactly a clock period, the delay control state machine may judge may whether the transition is equal to 1 for many times, for example, 15 times. When it is determined that the transition is equal to 0 for consecutive 15 times, the delay time is a clock period. Then, the process goes to step 713. Thus, the following problem may be solved: The transition may be changed to 0 occasionally due to errors, but the delay time does not reach a clock period.

Step 713: Enter the loading state, and determine the number of adjusting units and the number of delay units corresponding to the clock period.

In this embodiment, the clock period may be detected dynamically to compensate the impact of the PVT.

Although the invention has been described through some exemplary embodiments, the invention is not limited to such embodiments. It is apparent that those skilled in the art can make various modifications and variations to the invention without departing from the scope of the invention. The invention is intended to cover the modifications and variations provided that they fall in the scope of protection defined by the following claims or their equivalents.

What is claimed is:

1. A clock detection apparatus, comprising:
   a delay module comprising:
      a first delay unit;
      a second delay unit;
      an inverter;
      wherein, each of the first delay unit and the second delay unit comprises a logic gate for gating and a logic gate for delaying, the two logic gates have the function of invert a phase, an output port of the logic gate for gating electrically connected to an input port of the logic gate for delaying;
      an input port of the logic gate for gating of the first delay unit is electrically connected to an output port of the inverter, and an output port of the logic gate for delaying of the first delay unit is electrically connect to an input port of the logic gate for delaying of the second delay unit;
      an input port of the inverter is electrically connected to an input port of the logic gate for gating of the second delay unit; and
      the input port of the inverter is adapted to input a clock signal to be delayed, and the logic gate for delaying of the second delay unit is adapted to output a delayed clock signal;
   an adjusting module comprising:
      at least two adjusting units, wherein, each of the adjusting units comprises a NOT gate and a selecting inverter an output port of the NOT gate of each of the adjusting units is electrically connected to an input port of each selecting inverter, the NOT gates of the adjusting units are mutually cascaded each other and the selecting inverters of the adjusting units mutually cascaded each other; and
      an input port of a NOT gate of one adjusting unit is adapted to input a clock signal to be detected, and the selecting inverter the one adjusting unit is adapted to output the delayed clock signal to the delay module as a clock signal to be delayed of the delay module.

2. The apparatus of claim 1, further comprising:
a trigger, electrically connected to the adjusting module and a phase detector and adapted to output the clock signal to be detected to the adjusting module and the phase detector;
the phase detector, electrically connected to the delay module and a delay control state machine and adapted to obtain a transmission control signal according to the input clock signal to be detected and the clock signal delayed by the adjusting module and the delay module; and
the delay control state machine, electrically connected to the adjusting module and the delay module and adapted to convert a clock period to be detected to the number of adjusting units of the adjusting module and the number of delay units of the delay module according to the transmission control signal.

3. The apparatus of claim 1, further comprising a buffer wherein the buffer has a same delay time as the inverter, the buffer electrically connected to the input port of the inverter and the input port of the logic gate for gating of the second delay unit.

4. The apparatus of claim 1, further comprising:
N third delay units and M fourth delay units, wherein N and M are natural numbers and N is equal to M or N is next to M;
each third delay unit and each fourth delay unit comprising two logic gates adapted to invert a phase, a logic gate for gating and a logic gate for delaying, an output port of the logic gate for gating electrically connected to an input port of the logic gate for delaying; and
input ports of the logic gates for gating of the N third delay units electrically connected to the output port of the inverter; input ports of the logic gates for gating of the M fourth delay units electrically connected to the input port of the logic gate for gating of the second delay unit, the logic gates for delaying of the M fourth delay units cascaded in turn with the logic gates for delaying of the N third delay units, and the input port of the logic gate for delaying of the first delay unit electrically connected to the output port of the logic gate for delaying of the fourth delay unit in a cascade direction.

5. The apparatus of claim 1, wherein:
each of the logic gates is a NAND gate, and the delay module further comprises a selector;
when M is non zero and N is equal to or greater than M, an output port of the selector electrically connected to an input port of the logic gate for delaying of the third delay unit;
when M is non zero and N is smaller than M, an output port of the selector electrically connected to an input port of the logic gate for delaying of the fourth delay unit;
when M is 0, an output port of the selector electrically connected to an input port of the logic gate for delaying of the first delay unit;
the input ports of all the logic gates for gating further adapted to input gating signals, wherein the gating signals are adapted to obtain gated delay units, and the selector adapted to enable the logic gates for delaying of the gated delay units to invert a phase.

6. A digital locked loop (DLL), comprising a clock detection apparatus, adapted to detect a clock period to be detected, wherein the clock detection apparatus comprises:
a delay module comprising:
a first delay unit;
a second delay unit;
an inverter;
wherein, each of the first delay unit and the second delay unit comprises a logic gate for gating and a logic gate for delaying, the two logic gates have the function of invert a phase, an output port of the logic gate for gating electrically connected to an input port of the logic gate for delaying;
an input port of the logic gate for gating of the first delay unit is electrically connected to an output port of the inverter, and an output port of the logic gate for delaying of the first delay unit is electrically connect to an input port of the logic gate for delaying of the second delay unit;
an input port of the inverter is electrically connected to an input port of the logic gate for gating of the second delay unit; and
the input port of the inverter is adapted to input a clock signal to be delayed, and the logic gate for delaying of the second delay unit is adapted to output a delayed clock signal;
an adjusting module comprising:
at least two adjusting units, wherein, each of the adjusting units comprises a NOT gate and a selecting inverter an output port of the NOT gate of each of the adjusting units is electrically connected to an input port of each selecting inverter, the NOT gates of the adjusting units are mutually cascaded each other and the selecting inverters of the adjusting units mutually cascaded each other; and
an input port of a NOT gate of one adjusting unit is adapted to input a clock signal to be detected, and the selecting inverter of the one adjusting unit is adapted to output the delayed clock signal to the delay module as a clock signal to be delayed of the delay module.

7. The DLL of claim 6, further comprising a delay apparatus, the delay apparatus electrically connected to the clock detection apparatus and adapted to delay a clock signal to be delayed by a delay time corresponding to $kN_1$ adjusting units and $kN_2$ delay units, wherein k indicates a clock period delay ratio and $N_1$ and $N_2$ indicate respectively the number of adjusting units and the number of delay units equivalent to the clock period.

8. The DLL of claim 6, further comprising a ratio logic unit that is electrically connected to the clock detection apparatus and the delay apparatus, adapted to provide the delay ratio.

* * * * *